United States Patent [19]
Sanchez

[11] Patent Number: 5,091,763
[45] Date of Patent: Feb. 25, 1992

[54] SELF-ALIGNED OVERLAP MOSFET AND METHOD OF FABRICATION

[75] Inventor: Julian J. B. Sanchez, Mesa, Ariz.

[73] Assignee: Intel Corporation, Santa Clara, Calif.

[21] Appl. No.: 630,285

[22] Filed: Dec. 19, 1990

[51] Int. Cl.$^5$ .................... H01L 29/06; H01L 21/265
[52] U.S. Cl. .................... 357/23.9; 357/23.4;
357/23.14; 357/54; 357/59; 357/71; 437/29;
437/41; 437/192; 437/193; 437/200; 437/228;
437/913; 437/984
[58] Field of Search .................... 357/23.14, 23.4, 54,
357/23.9, 59, 71; 437/29, 41, 192, 193, 200, 228,
913, 984

[56] References Cited

U.S. PATENT DOCUMENTS 4,811,076  3/1989  Tigelaar et al. .................... 357/51
4,868,617  9/1989  Chiao .................... 357/23.14

OTHER PUBLICATIONS

IBM-Tech Disclosure Bulletin—vol. 14, No. 8, 1-19-72—Kaplan.
T. Huang & W. Yao et al., *A Novel Submicron LDD Transistor with Inverse-T Gate Structure*, —2/1986.
J. R. Pfiester & F. K. Baker et al., *A Self-Aligned LDD/Channel Implanted ITLDD Process with Selectively-Deposited Poly Gates for CMOS VLSI*—7/1989.
J. Sanchez, K. Hsueh, & T. DeMassa, *Drain-Engineered Hot-Electron-Resistant Device Structures: A Review*, IEEE Transactions on Electron Devices, vol. 36, No. 6, (Jun. 1989).
R. Izawa, T. Kure, S. Iijima & E. Takeda, *The Impact of Gate-Drain Overlapped LDD (Gold) for Deep Submicron VLSI's*—5/1987.
L. C. Parrillo & S. J. Cosentino et al., *A Versatile, High-Performance, Double-Level-Poly Double-Level-Metal, 1.2-Micron CMOS Technology*—2/1986.
J. R. Pfiester & L. C. Parillo et al., *An Integrated 0.5 Micron CMOS Disposable TiN LDD/Salicide Spacer Technology*—7/1989.
Ih-Chin Chen, C. C. Wei & C. W. Teng, *Simple Gate-to-Drain Overlapped MOSFET's Using Poly Spacers for High Immunity to Channel Hot-Electron Degradation*, IEEE Electron Device Letters, vol. 11, No. 2 (Feb. 1990).

*Primary Examiner*—Edward J. Wojciechowicz
*Attorney, Agent, or Firm*—Blakely, Sokoloff, Talylor & Zafman

[57] ABSTRACT

A high speed submicron transistor which exhibits a high immunity to hot electron degradation and is viable for VLSI manufacturing. An inner gate member is formed on a p type substrate. A first source region and a first drain region are disposed in the p type substrate in alignment with the inner gate member for forming a lightly doped region. A conductive spacer is formed adjacent to and is coupled to each side of the inner gate member on the gate oxide layer for forming a gate member which overlaps the lightly doped region. A second source region and a second drain region are disposed in the first source region and first drain regions, respectively, self-aligned with the outer edges of the conductive spacers to form source and drain contact areas.

14 Claims, 11 Drawing Sheets

SELF-ALIGNED OVERLAP MOSFET AND METHOD OF FABRICATION

BACKGROUND OF THE INVENTION

1. Field of the Invention

The invention relates to the field of metal-oxide semiconductor transistors. More particularly, it relates to the field of high speed, submicron channel transistors. The invention realizes a transistor with a VLSI manufacturable process.

2. Description of the Relevant Art

In submicron transistors hot electron injection into the gate is a serious reliability problem. Structures have been proposed in the attempt to design a high speed VLSI manufacturable submicron MOS transistor which exhibits resistance to hot electron degradation.

An inverse T-gate lightly doped (ITLDD) transistor or similar structures are effective devices at reducing hot electron generation for submicron transistors. The ITLDD transistor features a self-aligned n− gate-to-drain overlap and a self-aligned n+ source/drain implant. The inverse T-gate lightly doped drain structure is inappropriate for VLSI manufacturing because its process requires a timed etch for the polysilicon etch. When etching the polysilicon layer to form the inverse T-gate, there is no end point detection available to signal that the appropriate polysilicon shelf thickness is present. Since the n− lightly doped source/drain region is implanted through the polysilicon shelf, any inconsistency in shelf thickness would create a nonuniform doping structure.

SUMMARY OF THE INVENTION

A high speed submicron metal-oxide-semiconductor device fabricated on a p type substrate is described. The device includes a polysilicon or tungsten inner gate member formed on the p type substrate with an insulating layer between them. An n− source region and an n− drain region are formed in the p type substrate in alignment with opposite sides of the inner gate member for forming a lightly doped region. A conductive spacer of either polysilicon or TiN is formed adjacent to and coupled to each side of the inner gate member in order to form a gate which partially overlaps the n− source region and the n− drain region. An n+ source region and an n+ drain region are disposed in the n− source region and the n− drain region, respectively, in alignment with the conductive spacers in order to form source and drain contact areas. The n+ source region and the n+ drain region are self-aligned to the conductive spacers. The conductive spacers alleviate the need to use a timed etch, as in the case of the prior art inverse T-gate device. The resultant transistor has high immunity to hot electron degradation and is viable for VLSI fabrication techniques.

The performance of the transistor can be further improved by using an additional reoxidation step to form a thin oxide spacer between the inner gate member and the conductive spacers. The thin oxide spacers decrease the drain/gate capacitance associated with the gate overlap of the drain. Silicide can be formed on the source, drain and gate regions to reduce the device's contact resistance. Additional source/drain regions can also be utilized to further increase the transistor's resistance to hot electron injection.

BRIEF DESCRIPTION OF THE DRAWINGS

FIG. 5b illustrates the formation of a polysilicon inner gate member on the substrate of FIG. 5a.

FIG. 5e further illustrates the formation of n+ source/drain regions in the substrate of FIG. 5d.

FIG. 6b illustrates the formation of silicide on the n+ source/drain regions and on the polysilicon inner gate member of FIG. 6a.

FIG. 7a illustrates the formation of an additional source/drain region in the substrate of FIG. 6a.

FIG. 7b illustrates the formation of silicide on the n++ source/drain regions and on the polysilicon inner gate member of FIG. 7a.

FIG. 8b illustrates the formation of TiN or polysilicon layer on the substrate of FIG. 8a.

FIG. 9b illustrates the formation of a tungsten inner gate member on the substrate of FIG. 9a.

FIG. 9e further illustrates the formation of n+ source/drain regions in the substrate of FIG. 9d.

FIG. 10b illustrates the formation of silicide on the n+ source/drain regions and on the tungsten inner gate member of FIG. 10a.

FIG. 11a illustrates the formation of an additional source/drain region in the substrate of FIG. 10a.

FIG. 11b illustrates the formation of silicide on the n++ source/drain regions and on the inner gate member of FIG. 11a.

FIG. 12b illustrates the formation of a TiN or polysilicon layer on the substrate of FIG. 12a.

DETAILED DESCRIPTION OF THE PRESENT INVENTION

The present invention is a novel, high speed submicron metal-oxide-semiconductor transistor which exibits resistance to hot electrons and has a VLSI reliable fabrication process. In the following description, numerous specific details are set forth in order to provide a thorough understanding of the present invention. However, it may be obvious to one skilled in the art that the present invention may be practiced without these specific details. In other instances, well known metal-oxide-semiconductor transistor concepts and process techniques have not been set forth in detail in order to not unnecessarily obscure the present invention.

The present invention realizes a transistor which can be used in the latest high density VLSI circuits. The latest VLSI circuits attempt to pack transistors in higher and higher densities. It is, therefore, extremely advantageous to decrease the dimensions of the metal-oxide-semiconductor, field-effect transistor in order to increase the transistor density of VLSI circuits. Present MOS transistors in production have channel lengths on the order of one micron (1 $\mu$m). The present invention is a MOS transistor which shows good reliability and performance with channel lengths down to 0.3 $\mu$m for 5 v operation. The difficulty with producing such small channel transistors is that the electric field, for a given voltage, increases as the channel length decreases. It is well known that high electric fields near the drain induce hot electrons into the gate. Hot electron degradation causes shifts in threshold, drive current, subthreshold slope and transconductance resulting in failure of the device in the field. In order to reduce the hot electron junction, the peak electric field of the device must be decreased. The peak electric field, however, must be decreased without significantly reducing device performance.

It is to be noted that "n++", "n+" and "n−" are used throughout the present disclosure. The short hand notation specifies the electron concentration of various regions of a metal-oxide-semiconductor device. For instance, "n−" specifies a region of light electron concentration (on the order of $1 \times 10^{18}$ cm$^3$) while "n+" specifies a region of high electron concentration (on the order of $1 \times 10^{20}$ cm$^3$). It is also to be noted that "gate length" is used in its normal convention to refer to the size of the gate from the source to the drain.

Figure 1:
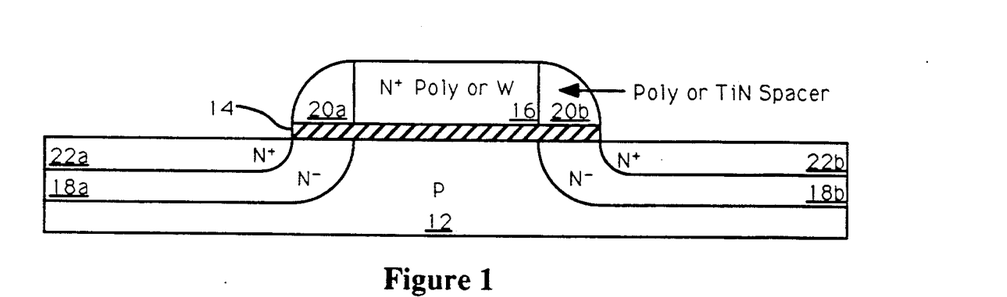
FIG. 1 is the self-aligned overlapped MOSFET of the present invention.

The presently preferred embodiment of the present invention is depicted in FIG. 1. The transistor is an n channel transistor fabricated in a p type substrate 12. A gate oxide layer 14 is grown on the p type substrate 12. An inner gate member 16 is formed on the gate oxide layer 14. The inner gate member 16 can be fabricated from either polysilicon or tungsten. A first pair of source/drain regions 18a and 18b of an n− conductivity are implanted in the p type substrate 12 in alignment with the sides of the inner gate member 16. The n− source/drain regions 18a and 18b provide for a lightly doped drain region. A conductive spacer is formed adjacent to the edges of the inner gate member over the gate oxide layer. The conductive spacers 20a and 20b can be either polysilicon or TiN. The conductive spacers 20a and 20b together with the inner gate member 16 form the gate for the transistor. A second pair of source/drain regions 22a and 22b of n+ conductivity are implanted into the n− source/drain regions and are self-aligned to the edges of the conductive spacers. The n+ source/drain regions form the source and drain contact regions of the device.

It is to be appreciated that the transistor shown in FIG. 1 is a symmetrical transistor. That is the source and the drain of the transistor are graded and doped similarly. In normal operation the n+ junction region 22a or 22b, which is coupled to ground will be the source of the device and the n+ junction region which is coupled to 5 volts will be the drain. It is to be understood that the grading and the lower doping of the drain reduces the hot electron degradation of the transistor. The source of the transistor does not have the hot electron injection problem of the drain, so neither a lightly doped region nor a grading are required for the source. The source, however, is not significantly hampered by the grading nor the lower doping so symmetrical devices are manufactured thereby making the transistor more versatile and easier to fabricate.

The n− and n+ source/drain regions of the present invention form a lightly doped drain structure which increases the device's reliability by decreasing the peak electric field. The lightly doped drain structure uses both a lower doping and grading for the drain to reduce the peak electric field. The lightly doped drain structure reduces the electric field for a given voltage by spreading the drain voltage drop over a wider depletion region. However, the present invention is an improvement over the traditional in that conductive spacers reside over the n− source/drain regions. The drive capacity of the traditional LDD device unfortunately is significantly reduced due to the increased gate drain series resistance caused by the lower doping of the first source/drain regions 18a and 18b. The conductive spacers, however, significantly minimize the reduction in drive current due to the lightly doped drains by assuring that the n− source/drain regions are in accumulation with a positve gate voltage. The conductivity of the n− source/drain regions, therefore, is not governed by the doping concentration, but rather by the gate voltage. Since these devices are used in digital mode the transistor has 5 v applied to the gate in the "on" condition insuring high conductivity. The high conductivity over the n− source/drain regions for devices which use conductive spacers minimizes any reduction in drive current while at the same time minimizing the peak electric field. The high conductivity possible with conductive spacers also minimizes any degradation due to interface states generated during hot electron injection. Also, since the amount of gate drain overlap is very critical in assessing the device preformance and reliability one would like a controllable process. Spacer technology has proven to be very controllable and suitable for a manufacturing environment.

The present invention utilizes a gate-to-drain overlap (GOLD) structure. The structure is formed by placing conductive spacers 20a and 20b over the n− lightly doped drain region. The gate to drain overlap structure increases the reliability of the transistor by positioning the peak electric field underneath the gate. Locating the peak electric field underneath the gate increases the lifetime of the device by minimizing the voltage drop between the drain and channel when the gate voltage is high. Also, locating the peak electric field underneath the gate minimizes the ability of localized charges (trapped charges and interface states) to raise the drain resistance thereby reducing drive capability and decreasing the transistor's performance. In other words, reduction in drive capability caused by using lower doped drain 18a and 18b is minimized by locating the peak electric field underneath the gate. This allows the use of a much lower n− concentration than traditionally used with LDD devices further lowering the peak electric field and reducing hot electron generation. The drain-to-gate overlap region, however, increases the drain/gate capacitance of the device which slightly degrades the device's speed. The reduction in peak electric field, however, allows the fabrication of a transistor with a shorter channel length which improves the speed of the device thus compensating the increase of the drain/gate capacitance.

The n− source/drain regions 18a and 18b are implanted at much higher energies into the p-type substrate than the n+ source/drain regions 22a and 22b. The high energy implant results in the formation of a sloped junction profile. A sloped junction profile results in a drain current which flows away from the surface and which is collected by the drain in the bulk. Since the current is directed away from the surface the probability of injection into the gate oxide is lowered. In addition the sloped junction separates the maximum current density from the peak electric field further lowering the probability of injection into the gate.

The present invention utilizes conductive spacers 20a and 20b to form the gate overlap of the drain. The spacers are formed adjacent to the inner-gate member 16 and are coupled to the inner gate member 16. The result is a larger gate and a gate which overlaps the lightly doped drain regions 18a and 18b. The conductive spacers 20a and 20b may be formed from titanium nitride or polysilicon.

The inner-gate member 16 is formed over the gate oxide layer 14. The inner gate member 16 provides alignment for the first source/drain regions (n− regions). The inner gate member 16 also masks the p type substrate from the source/drain implant, thereby forming a channel region for the device. The inner gate member 16 can be fabricated from either tungsten or polysilicon. Tungsten is preferred, however, because tungsten gates are known to increase n channel mobilities as well as punch-through voltages. The use of a tungsten gate also creates threshold voltages of between 0.6 v to 0.7 v alleviating the need for a threshold adjusting implant. A tungsten gate also gives the MOS device a higher transconductance (gm) than a polysilicon gate thereby increasing both the speed and the gain of the device. By lowering the resistance of the gate, a tungsten gate can help to offset the speed reductions due to increased capacitance caused by the gate-to-drain overlap of the device.

Figure 2:
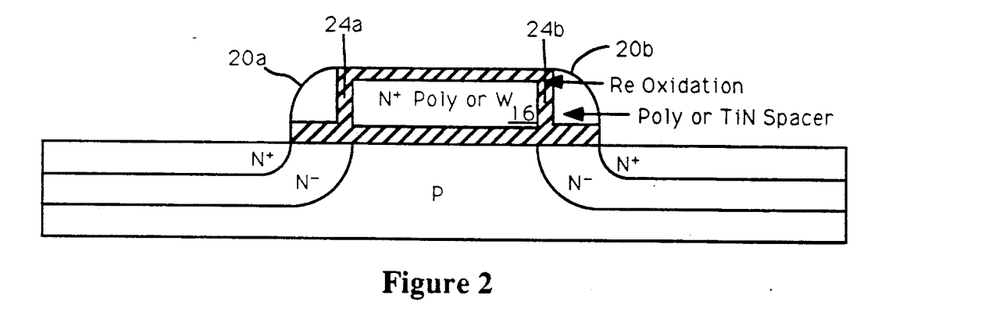
FIG. 2 is the self-aligned overlapped MOSFET of the present invention with reoxidation spacers.

The performance of the self-aligned overlapped MOSFET of the present invention may be improved by providing a thin oxide spacer between the inner gate member and the conductive spacers as shown in FIG. 2. The thin oxide spacers 24a and 24b decrease the drain/gate capacitance associated with the gate overlap of the drain. The conductive spacers 20a and 20b are coupled to the inner gate member 16 by exposing the thin oxide spacers 24a and 24b to a heavy n+ source/drain implant. The conductive spacers 20a and 20b are effectively coupled to the inner gate member through a resistor of 1 to 100 mΩ. The resistance is low enough to maintain substantially the same potential across the inner gate member 16 and the conductive spacers 20a and 20b.

Figure 3:
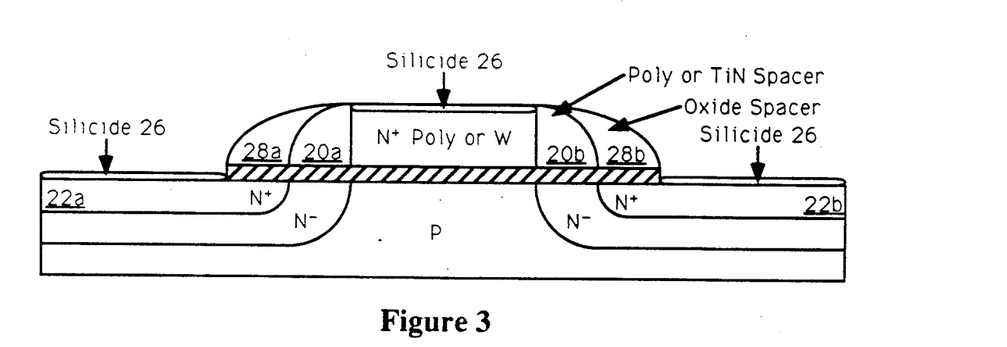
FIG. 3 is a cross sectional elevation view of a silicide self-aligned overlapped MOSFET of the present invention.

The performance of the present self-aligned overlap MOSFET may be further improved by forming silicide on the source, drain and gate of the device as shown in FIG. 3. The transistor's performance is improved by reducing its contact resistance. The silicide 26 reduces the resistance of the n+ source/drain regions from 20 ohms/square to 4 ohms/square. In order to form silicide on the gate, source and drain regions of the present invention, oxide spacers 28a and 28b are utilized. The oxide spacers 28a and 28b provide masking for the conductive spacers 20a and 20b. The masking prevents the gate from becoming shorted to the n+ source/drain regions 22a and 22b by the silicide layer.

Figure 4:
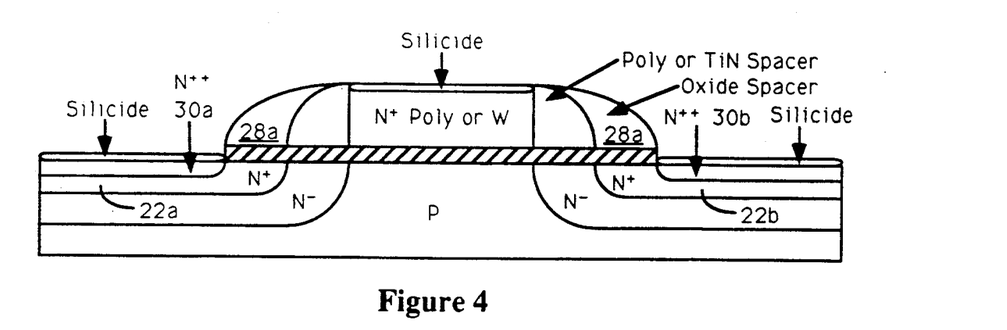
FIG. 4 is a cross sectional elevation view of a self-aligned overlapped MOSFET of the present invention with an additional grading of the drain.

The self-aligned overlap MOSFET of the present invention may be made even more resistant to hot electron injections by grading the drain an additional or multiple amount of times as shown in FIG. 4. The grading of the drain is formed by making an additional source/drain implant. The additional implant is formed in alignment with the outer edges of the oxide spacers 28a and 28b. The doping levels of n− and n+ source/drain regions are chosen to provide additional grading of the source/drain region. The n++ regions serve as the ohmic contact for the device. The n++ source/drain regions 30a and 30b are formed at a depth less than the n+ source/drain regions 22a and 22b into the p type substrate. Oxide spacers 28a and 28b are formed adjacent to the conductive spacers to self-align and offset the n++ source/drain implant. The n++ source/drain regions 30a and 30b form the source and drain contact regions of the device. The additional source/drain regions create a greater tailoring of the drain region thereby further improving the device's resistance to hot electron injection. Silicide may be formed on the source, drain and gate of the device to reduce the contact resistance.

FABRICATION OF THE SELF-ALIGNED MOSFET WITH A N+ POLYSILICON GATE

Figure 5A:
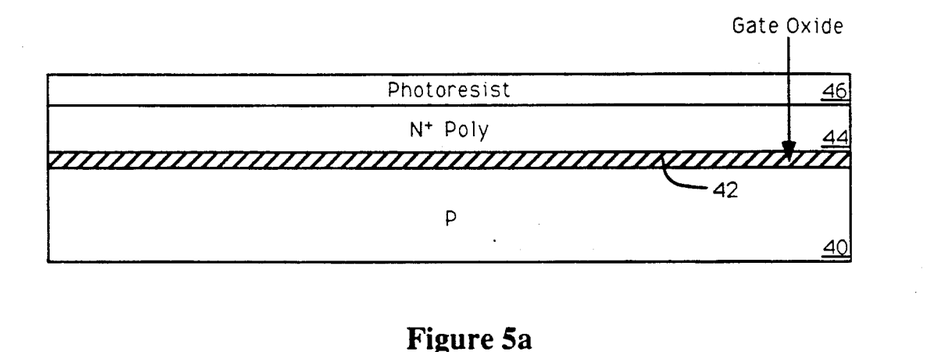
FIG. 5a is a cross sectional elevation view of p-type substrate which includes a gate oxide layer, and a polysilicon layer.

In the fabrication of the invented submicron metal-oxide-semiconductor device with a polysilicon inner gate member, a p type silicon substrate 40 shown in FIG. 5a is used. The p type substrate 40 is doped with Boron atoms to a level of 10 to 15 ohms-cm. A 100 Å oxide layer 42 is grown over the p-type substrate which will be used later to form the gate oxide layer of the device. The gate oxide layer is grown in a diffusion furnace at 920° C. at atmosphere in 97% $O_2$ and 3% TCA. A polysilicon layer 44 is deposited on the oxide layer which will later be formed into an inner gate member for the device. The polysilicon is deposited to a thickness of 3,500 Å by low pressure chemical vaper deposition (LPCVD) at 615° C. at 130–190 mtorr in $SiH_4$. The polysilicon is next doped in a diffusion furnace at 920° C. at atmosphere with $POCl_3$. An approximately one micron thick photoresist layer is deposited on the n+ polysilicon layer 44.

Figure 5B:
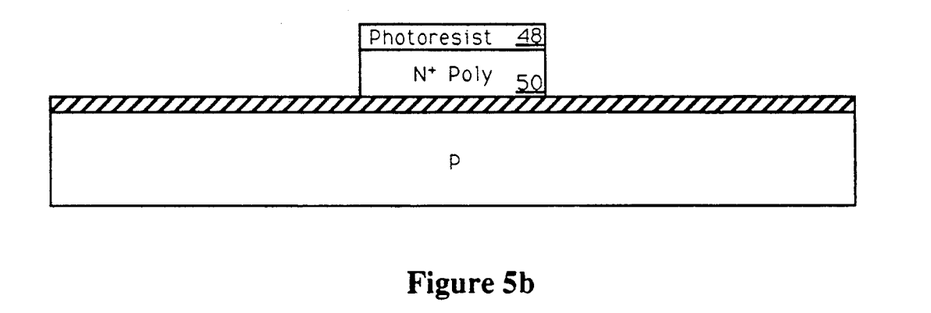

In reference to FIG. 5b, the photoresist layer is masked, exposed, and developed to define the length and location where the inner gate member will be formed. The photoresist mask 48 prevents the area of the polysilicon layer 50 under the photoresist mask 48 from being etched.

The polysilicon layer is etched with an etchant which has a polysilicon selectivity over oxide of around 30:1; therefore, once the gate oxide layer has been reached, an end point detection signal will be generated signalling the completion of the polysilicon etch. The inner gate member 50 is fully defined once the etch stop signal is generated. The polysilicon is etched by Reactive Ion Etching with $CF_4/O_2$ at a power of 250 watts and a pressure of 2.00 T for 5 minutes.

Figure 5C:
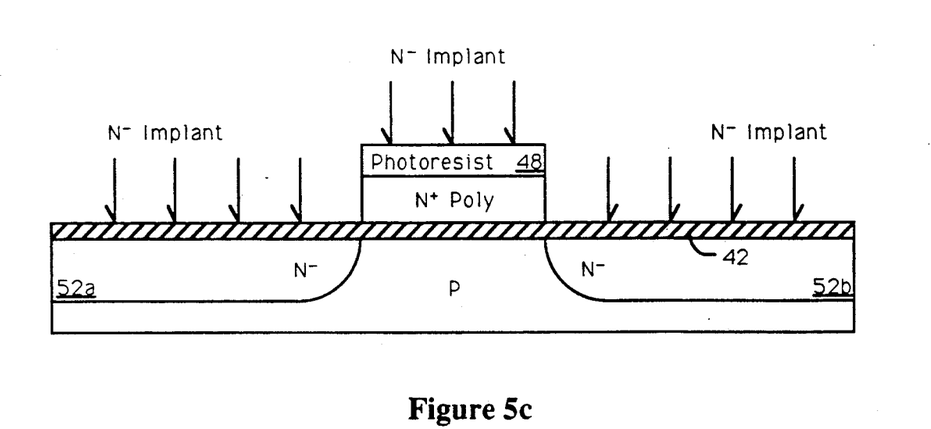
FIG. 5c illustrates the formation of first source/drain regions in the substrate of FIG. 5b.

Referring to FIG. 5c, an n− implant is made to form n− source/drain regions 52a and 52b. The n− source/drain regions are formed deep in the p-type substrate 40 by implanting phosphorus atoms at a density of $5 \times 10^{12}$ atoms/cm$^2$ and an energy of 50 kev. The entire structure is implanted with arsenic atoms through the oxide layer 42. The photoresist mask 48 prevents the channel region of the p-type substrate from becoming n− doped. Since the n-implant defines the channel region of the device, the n− source/drain regions are self-aligned to the channel region.

Figure 5D:
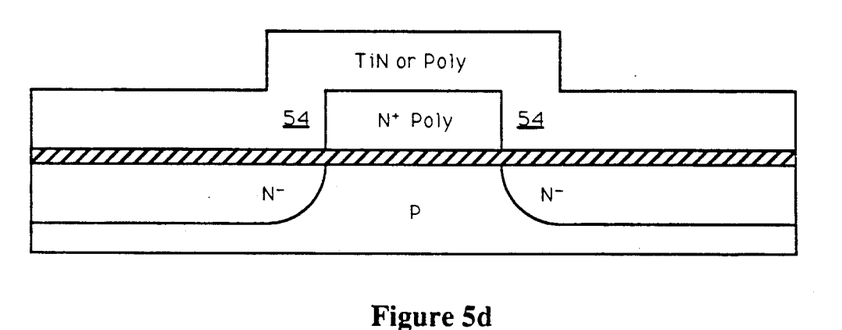
FIG. 5d illustrates the formation of a conformal TiN or polysilicon layer over the substrate of FIG. 5c.

Referring now to FIG. 5d the photoresist mask 48 is removed by plasma ashing in $O_2$ for 30 minutes. Next a very conformal TiN or polysilicon layer 54 is deposited over the device. The TiN or polysilicon layer 54 fully covers the device. If TiN is used, it is sputtered to a thickness of 2,000 Å from a Ti target in $N_2$ atmosphere at 4 mtorr of pressure and 3 kw of power. The mixture exhibits excellent conformality and is useful in defining spacers. If polysilicon is used, it is formed to a thickness of 2,500 Å by LPCVD at 615° C. at 130–190 mtorr in $SiH_4$.

In the present invention, TiN is the preferred material for the conductive spacers. TiN is formed with a low temperature process which results in a layer which is very conformal and which has a consistent thickness across the wafer. Polysilicon formation on the other hand, utilizes a chemical vaper deposition technique which yields a layer which is not as uniform across the wafer. Nonuniform layer thicknesses cause conductive spacers of varying length (Ln−) to be formed across the wafer. Conductive spacer length determines the amount of gate overlap of the drain and therefore directly affects the transistor's performance and reliability. TiN spacers are, therefore, utilized to insure consistent reliability and performance of the fabricated devices.

Figure 5E:
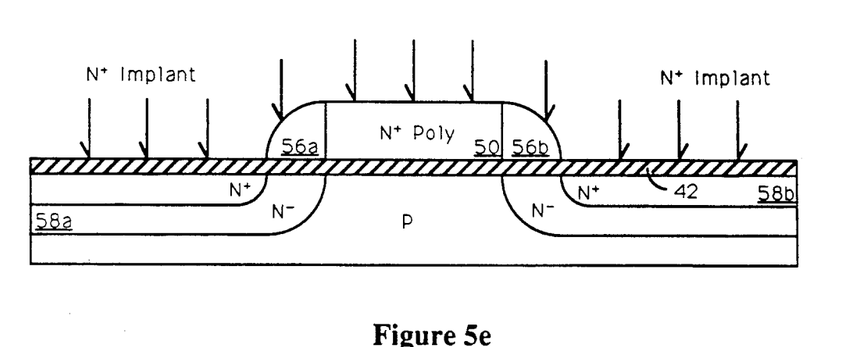
FIG. 5e illustrates the formation of conductive spacers to form a larger gate and a gate which overlaps the n− source/drain regions.

In FIG. 5e, the TiN or polysilicon layer 54 is formed into a pair of conductive spacers 56a and 56b. The TiN or polysilicon layer 54 is anisotropically etched to form conductive sidewall spacers about 0.15 μm long. If TiN is used it is etched by RIE at a pressure of 25 mtorr in $BCl_3$ and $Cl_2$ at flows of 125 sccm and 10 sccm, respectively. A base of 260 volts is maintained, as is the hexode temperature of 60° C. The TiN etch is followed by a Rapid Thermal Anneal (RTA) at 1050° C. for 15 seconds in nitrogen. If polysilicon is used, it is etched by RIE at 250 watts of power and a pressure of 200 T in $CF_4/O_2$.

Both TiN and polysilicon can be end point detected. End point detection is important to control the amount of overetching. Overetching is required whenever anisotropic etching is coupled with stepped topography, as in the present case. Controlling the overetching is important to guarantee the correct spacer length. The conductive sidewall spacers 56a and 56b are formed adjacent to and are coupled to the n+ polysilicon inner gate member 50 thereby forming a larger gate. The larger gate partially overlaps the n− doped source/drain regions to form a gate to drain and gate to source overlap structure.

In FIG. 5e, a second source/drain implant is made to form the n+ source/drain regions 58a and 58b. Because the conductive spacers 56a and 56b provide masking for the n+ implant, the n+ source/drain regions 58a and 58b are self-aligned to the outside edges of the conductive spacers. This technique guarantees that there is no undesired n+ to gate offset formed by misalignment. The n+ implant is made with arsenic atoms through the gate oxide layer 42 at a density of $1 \times 10^{15}$/cm$^2$ and an energy of 50 kev. The n+ source/drain regions 58a and 58b are formed in the n-source/drains 52a and 52b. The n+ source/drain regions 58a and 58b form the contact regions of the device.

Figure 5F:
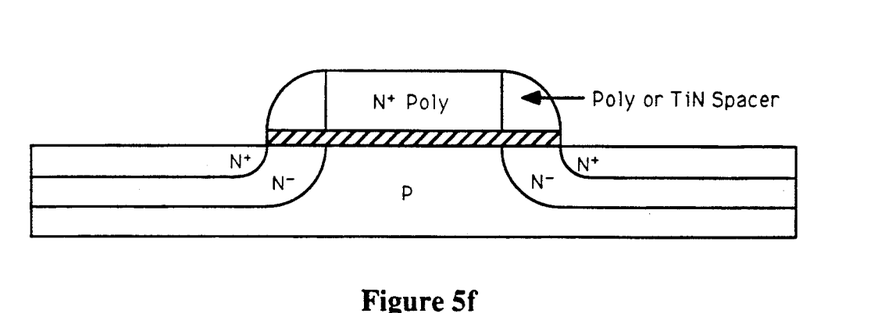
FIG. 5f illustrates the completed self-aligned overlap MOSFET with a polysilicon gate of the present invention.

It is to be appreciated that the self-aligned overlapped MOSFET with a polysilicon gate may now be completed by removing the gate oxide layer 42 which exists over the n+ source/drain regions 58a and 58b as shown in FIG. 5f. The oxide is removed by etching in $CF_4/CHF_3$ at a power of 1000 watts and a pressure of 3.2 T for 20 seconds. At this time, other well known process steps are used to complete the fabrication of the self-aligned overlapped MOSFET. For example, metal contacts are also fabricated at this time to electrically couple the device to other elements in the circuit. A protective glass or passivation is formed over the device to protect the device from contamination and electrical shorts.

Figure 6A:
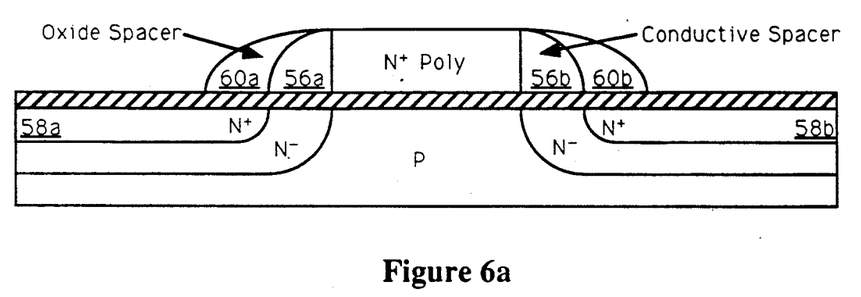
FIG. 6a illustrates the formation of oxide spacers on the substrate of FIG. 5e.

If desired, the self-aligned overlapped MOSFET of FIG. 5e may be further processed beyond step 5e to increase the device's performance. The performance can be increased by forming silicide on the contact areas of the device to reduce the contact resistance. In FIG. 6a, a pair of oxide spacers are formed on the substrate of FIG. 5e. First, a CVD oxide layer is deposited over the entire device structure. The CVD oxide layer is then anisotropically etched to form the oxide spacers 60a and 60b. The oxide spacers 60a and 60b mask the conductive spacers 56a and 56b from the silicide layer, preventing the conductive spacers 56a and 56b from becoming electrically shorted to the n+ source/drain regions 58a and 58b.

Figure 6B:
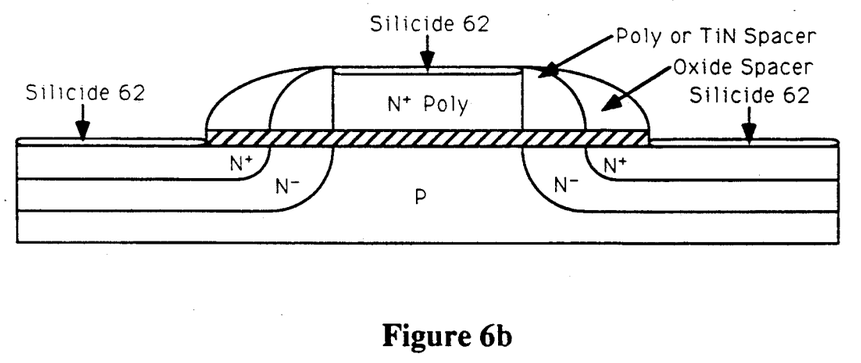

In FIG. 6b, the gate oxide layer 42 on the n+ source/drain region is etched away. Titanium silicide is then formed over the entire device structure. The titanium silicide is annealed to drive the titanium from the silicide into the polygate and contact regions of the device. The titanium silicide is then selectively wet-etched, thereby leaving titanium silicide 62 only on the contact regions of the device. The silicide self-aligned MOSFET of the present invention is now completed.

Figure 7A:
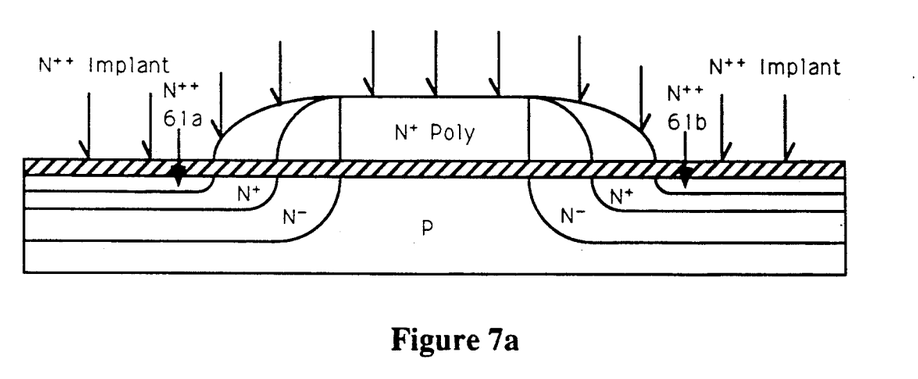
Figure 7B:
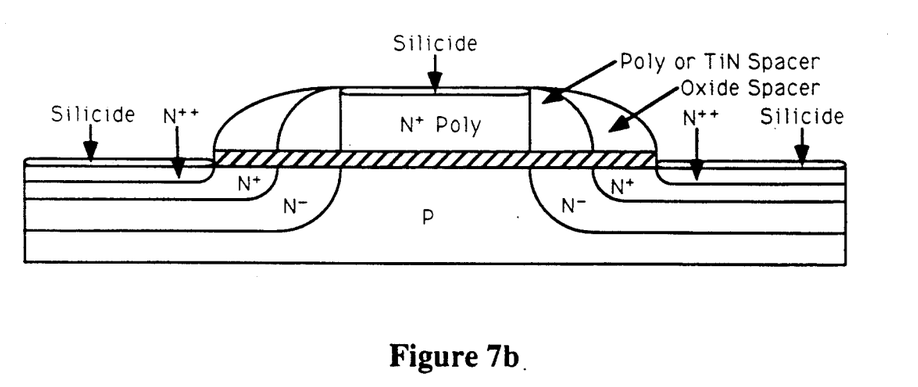

If desired, after the oxide spacers are formed in 6a, an additional source/drain implant may be provided to further tailor the doping profile to increase the device's resistance to hot electron injections. In FIG. 7a, a third source/drain implant is made after the processing of FIG. 6a. The third source/drain implant is made of arsenic atoms at a doping density of $1 \times 10^{21}$/cm$^2$ and an energy of about 45 kev. The n++ implant is made through the gate oxide layer into the n+ source/drain regions 58a and 58b for forming n++ source/drain regions. The n++ source/drain regions 61a and 61b are aligned to the outside edges of the oxide spacers 60 and 60b. The additional source/drain implant allows further grading of the drain to increase the device's resistance to hot electron degredation. If desired, FIG. 7a may be further processed in the manner shown in FIG. 6b in order to form silicide on the contact regions of the device and thereby decrease the device's contact resistance. The resultant transistor is shown in FIG. 7b.

Figure 8A:
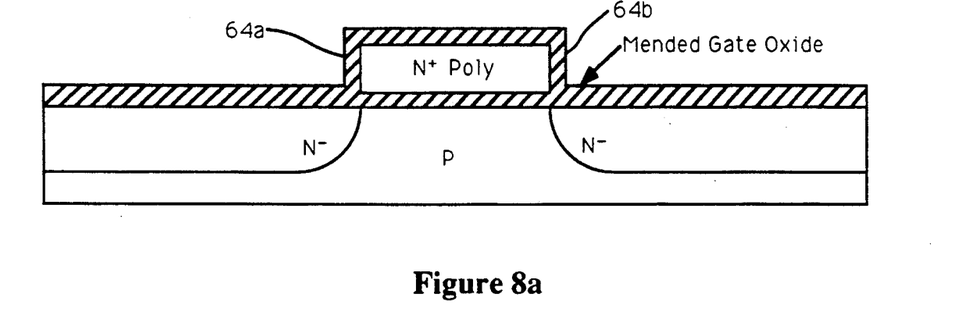
FIG. 8a illustrates the reoxidation of the substrate of FIG. 5c.

The performance and reliability of the self-aligned overlapped MOSFET with a polysilicon gate can be further improved by utilizing a reoxidation step. In FIG. 8a, a reoxidation is made after the photoresist mask 48 is removed from the substrate shown in FIG. 5c. The reoxidation step provides two benefits. First, the reoxidation provides a method of mending the gate oxide layer where the conductive spacers will eventually be formed. Mending the gate oxide is beneficial because the gate oxide layer can be damaged during of the inner gate etching of FIG. 5b. Second, the reoxidation process provides a thin oxide sidewall spacer adjacent to each side of the inner gate member 50. The thin oxide side wall spacers 64a and 64b decrease the gate/drain capacitance associated with the conductive spacer overlap of the drain. Reducing the gate/drain capacitance increases both the speed and gain of the device.

Figure 8B:
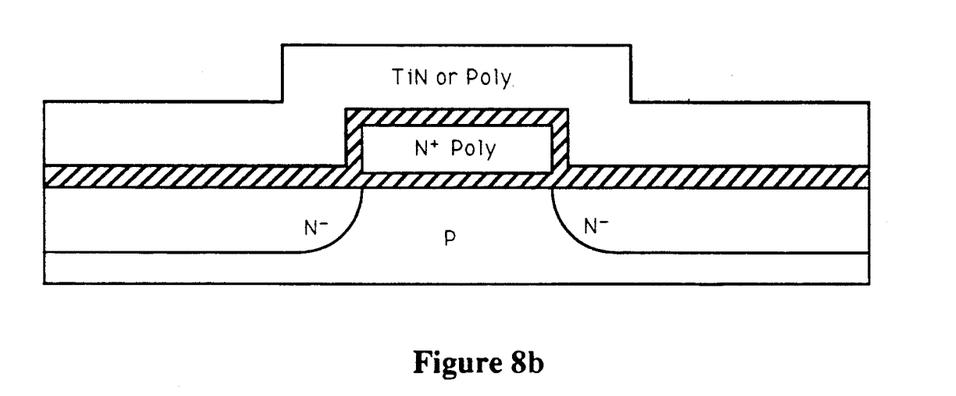
Figure 8C:
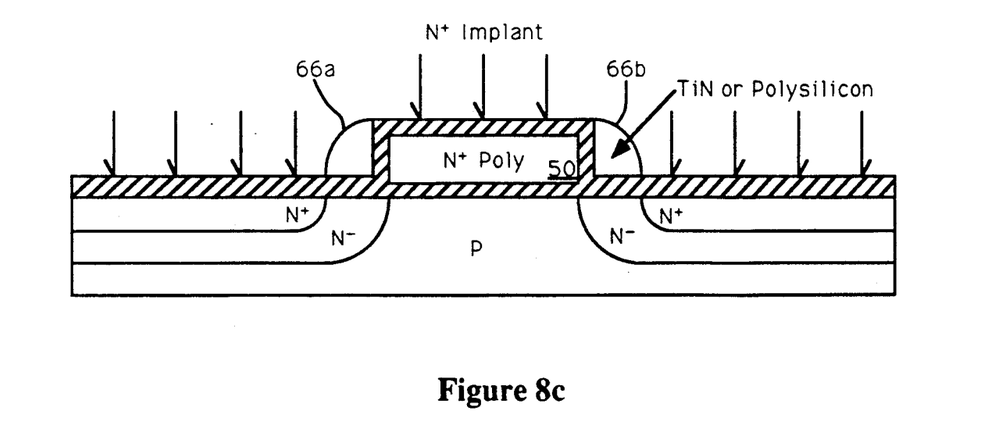
FIG. 8c illustrates the formation of conductive spacers and illustrates the formation of the n+ source/drain regions on the substrate of FIG. 8b.

After reoxidation, the processes detailed in FIGS. 5d and 5e are used to complete the fabrication of the reoxidation self-aligned overlap MOSFET with a polysilicon gate. In FIG. 8b the process detailed in FIG. 5d is used to deposit a conformal layer of TiN or polysilicon on the reoxidation layer. Next, in FIG. 8c the TiN or polysilicon layer is etched and the n+ source/drain regions are formed as defined in FIG. 5e. It is to be noted that although the conductive spacers 66a and 66b and the n+ polysilicon inner gate member 50 are separated by a thin oxide side wall spacer, they are electrically coupled together. The heavy n+ source/drain implant of FIG. 5e essentially damages the exposed portion of the thin oxide side wall spacers, effectively coupling the spacers to the inner gate member. It is to be appreciated that the processes of FIGS. 7a and 7b and FIGS. 6a and 6b may also be utilized in order to increase the grading of the device and to decrease the contact resistance of the device, respectively.

FABRICATION OF THE SELF-ALIGNED MOSFET WITH A TUNGSTEN GATE

Figure 9A:
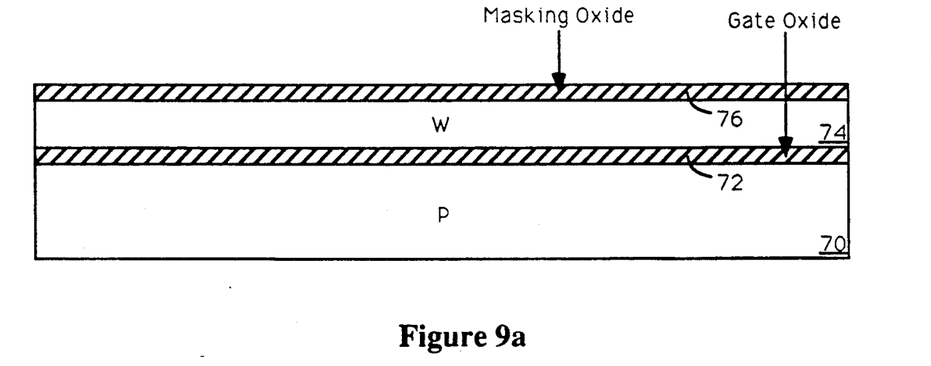
FIG. 9a is a cross sectional elevation view of a p-type substrate which includes a gate oxide layer, a tungsten layer, and a masking oxide layer.

In the fabrication of the invented submicron metal-oxide-semiconductor device with a tungsten gate with the presently preferred process, a p type silicon substrate 70 shown in FIG. 9a is used. The p type substrate 70 is doped with Boron atoms to a level of 10 to 15 ohms-cm. An oxide layer 72 is grown over the p-type substrate which will be used later to form the gate oxide layer of the device. The oxide layer is grown to a thickness of 100 Å in a diffusion furnace at 920° C. at atmospheric pressure in 97% $O_2$ and 3% TCA. A 1000 Å tungsten layer 74 is sputtered on the oxide layer which is later formed into an inner gate member for the device. The tungsten layer is sputtered from a W target in Argon at a pressure of 55 mtorr and a power of 6 kw. An oxide layer 76 is formed on the tungsten layer 74 to be used later for masking a polysilicon etch. The oxide layer is a low temperature oxide with 8% phosphorous. It is formed by LTLPCVD at 400° C. at 2.00 T in 60% $O_2$, 11% $SiH_4$ and 29% DPI (DPI is 15% phosphine and 85% Silane).

Figure 9B:
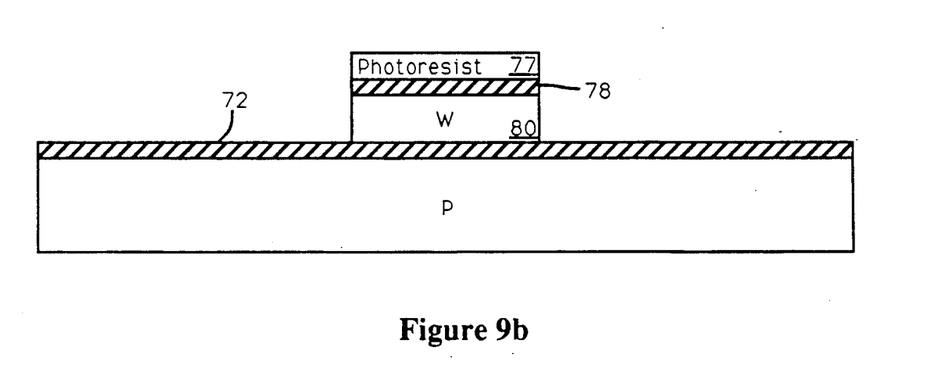

In reference to FIG. 9b, the oxide layer 76 is covered with one micron of photoresist 77. The photoresist is masked, exposed, and developed to define the length and location where the inner gate member will be formed. The oxide layer is then etched by Reactive Ion Etching in $CF_4/CHF_3$ at a power of 1000 watts and a pressure of 3.2 T. An oxide mask 78 with similar configurations as the photoresist mask is formed.

Next, the tungsten layer 74 is etched by RIE at a power of 250 watts and a pressure of 2.0 T in $CF_4/O_2$ to form a tungsten inner gate member 80. The photoresist and oxide masks prevent the tungsten layer beneath the masks from being etched. The etchant has a tungsten selectivity over oxide of around 30:1; therefore, once the gate oxide layer 77 has been reached, an end point detection signal will be generated signalling the completion of the tungsten etch.

Figure 9C:
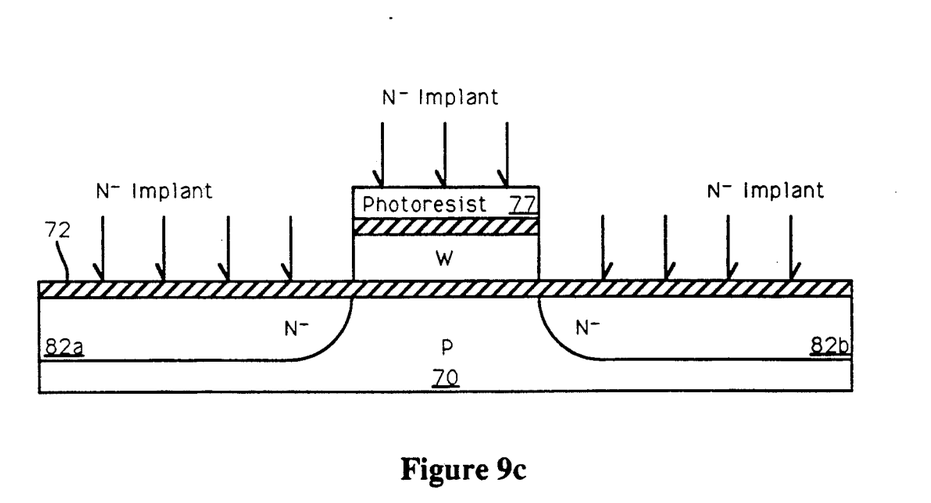
FIG. 9c illustrates the formation of first source/drain regions in the substrate of FIG. 9b.

Referring to FIG. 9c, an n− implant is made to form n− source/drain regions 82a and 82b. The n− source/drain regions are formed deep in the p type substrate 70 by implanting phosphorous atoms at a density of $5 \times 10^{12}/cm^2$ and an energy of 50 kev. The entire structure is implanted with arsenic atoms through the oxide layer 72. The photoresist mask 77 prevents the channel region of the p-type substrate from becoming n− doped. Since the n− implant defines the channel region of the device, the n− source/drain regions are self-aligned to the channel region.

Figure 9D:
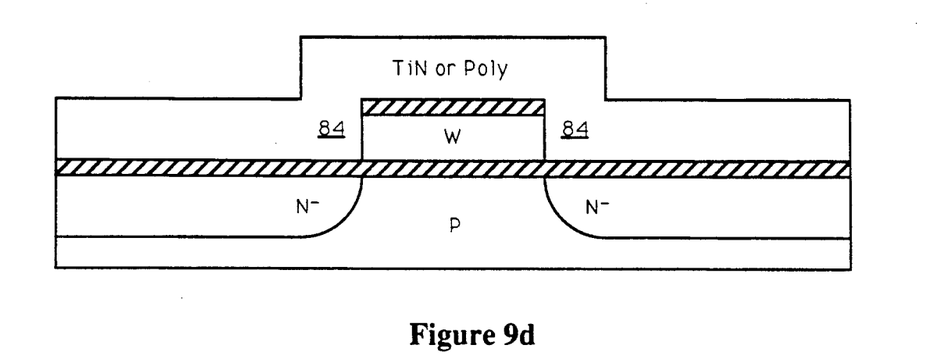
FIG. 9d illustrates the formation of a conformal TiN or polysilicon layer over the substrate of FIG. 9c.

Referring now to FIG. 9d, the photoresist mask 77 is removed by plasma ashing in $O_2$ for 30 minutes. Next, a conformal TiN or polysilicon layer 84 is deposited over the device. The TiN or polysilicon layer 84 fully covers the device. The TiN and polysilicon layers are formed to thicknesses and by processes previously defined in this application.

Figure 9E:
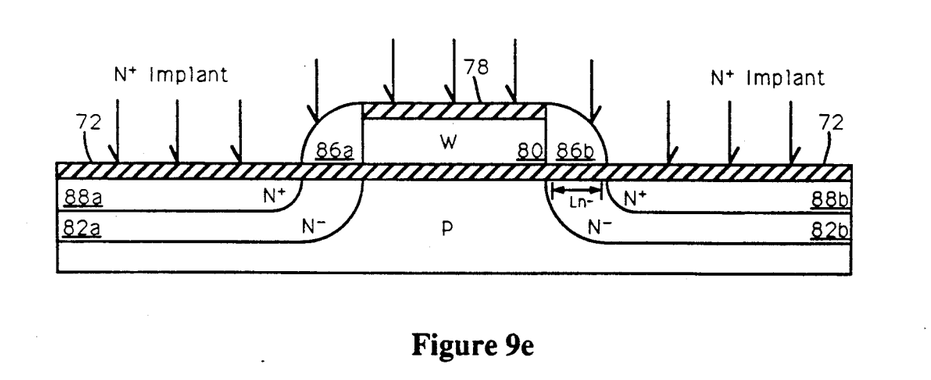
FIG. 9e illustrates the formation of conductive spacers to form a larger gate and a gate which overlaps the n− source/drain regions.

In FIG. 9e, the TiN or polysilicon layer 84 is formed into a pair of conductive spacers 86a and 86b. The TiN or polysilicon layer 54 is anisotropically etched by processes previously revealed to form conductive sidewall spacers about 0.15 μm long (Ln−). Both TiN and polysilicon can be end point detected. End point detection is important to control the amount of overetching. Overetching is required whenever anisotropic etching is coupled with stepped topography, as in the present case. Controlling the overetching is important to guarantee the correct spacer length (Ln−). The conductive sidewall spacers 86a and 86b are formed adjacent to and are coupled to the inner gate member 80 thereby forming a larger gate. The larger gate partially overlaps the n− doped source/drain regions and forms a gate to drain and gate to source overlap structure of the device.

In FIG. 9e, a second source/drain implant is made to form the n+ source/drain regions 88a and 88b. Because the conductive spacers 86a and 86b provide masking for the n+ implant, the n+ source/drain regions 88a and 88b are self-aligned to the outside edges of the conductive spacers. The n+ implant is made with arsenic atoms through the gate oxide layer at a density of $1 \times 10^{15}/cm^2$ and an energy of 50 kev. The n+ source/drain regions 88a and 88b are formed in the n-source/drains 82a and 82b. The n+ source/drain regions 88a and 88b form the contact regions of the device.

It is to be appreciated that the self-aligned overlapped MOSFET with a tungsten gate may now be completed by removing the masking oxide layer 78 and the gate oxide layer 72 which exists over the n+ source/drain regions 88a and 88b. At this time, other well known process steps are used to complete the fabrication of the self-aligned overlapped MOSFET. For example, metal contacts are also fabricated at this time to electrically couple the device to other elements in the circuit. A protective glass or passivation is formed over the device to protect the device from contamination and electrical shorts.

Figure 10A:
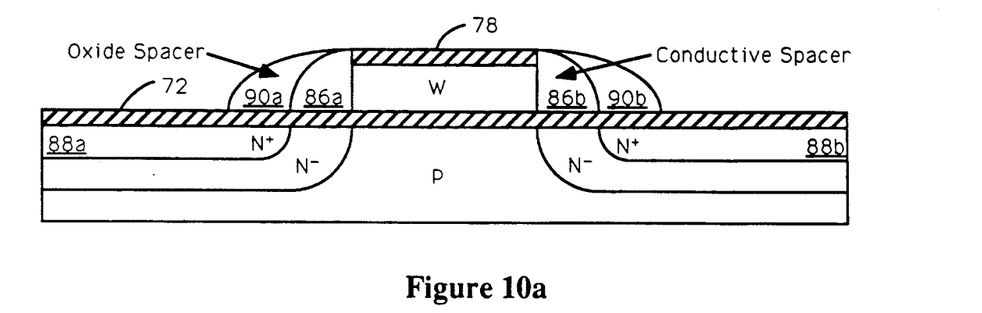
FIG. 10a illustrates the formation of oxide spacers on the substrate of FIG. 9e.

If desired, the self-aligned overlapped MOSFET with a tungsten gate may be further processed beyond FIG. 9e to increase the device's performance. The performance can be increased by forming silicide on the contact areas of the device to reduce the contact resistance. In FIG. 10a, a pair of oxide spacers 90a and 90b are formed on the substrate of FIG. 9e. First, a CVD oxide layer is deposited over the entire device structure. The CVD oxide layer is then anisotropically etched to form the oxide spacers 90a and 90b. The oxide spacers 90a and 90b mask the conductive spacers 86a and 86b from the silicide layer, preventing the conductive spacers 86a and 86b from becoming electrically shorted to the n+ source/drain regions 88a and 88b.

Figure 10B:
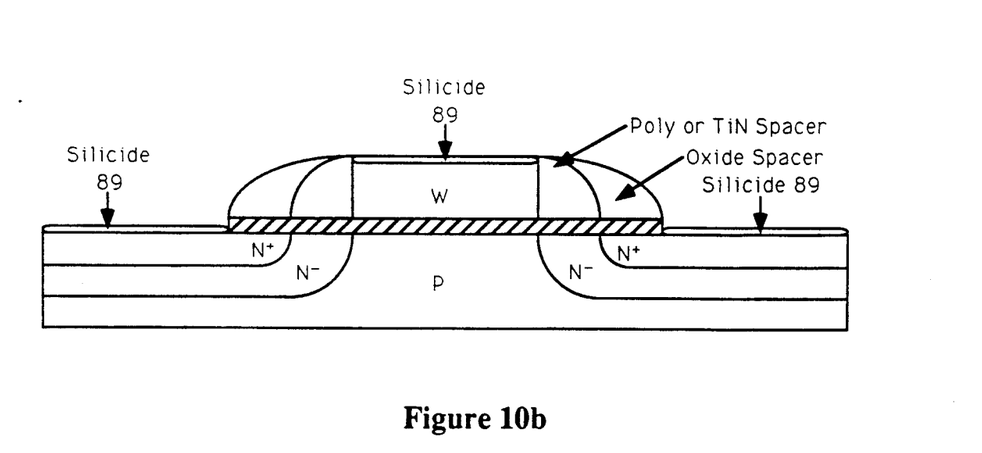

In FIG. 10b, the masking oxide layer 78 on the inner gate member and the gate oxide layer 72 on the n+ source/drain regions 88a and 88b are etched away. Titanium silicide is then formed over the entire device structure. The titanium silicide is annealed to drive the titanium from the silicide into the contact regions of the device. The titanium silicide is then selectively wet-etched, thereby leaving titanium silicide 89 only on the contact regions of the device. The silicide self-aligned overlap MOSFET with a tungsten gate is now complete.

Figure 11A:
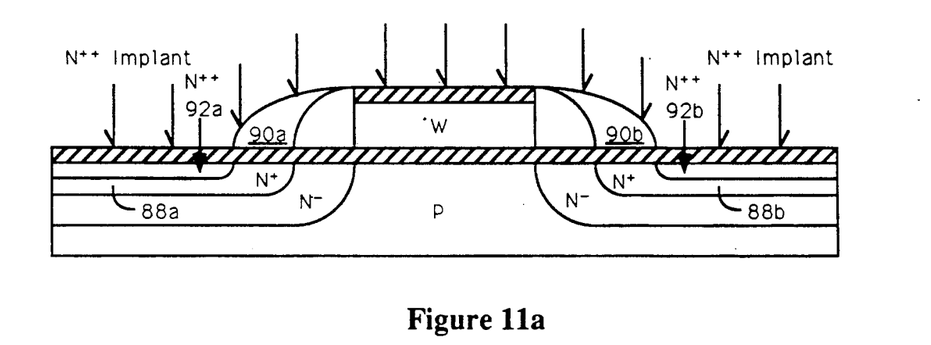
Figure 11B:
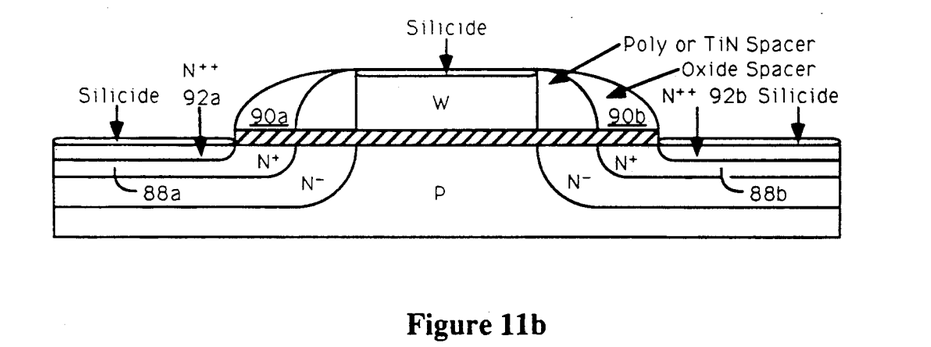

If desired, after the oxide spacers are formed in 10a, an additional grading of the drain may be provided to further increase the device's resistance to hot electron injections. In FIG. 11a, a third source/drain implant is made after the processing of FIG. 10a. The third source/drain implant is made of arsenic atoms at a doping density of $1 \times 10^{21}/cm^2$ and an energy of about 45 kev. The n++ implant is made through the gate oxide layer into the n+ source/drain regions 88a and 88b for forming n++ source/drain regions. The n++ source/drain regions 92a and 92b are aligned to the outside edges of the oxide spacers 90a and 90b. The additional source/drain implant allows further grading of the drain to increase the device's resistance to hot electron degredation. If desired, FIG. 11a may be further processed in the manner of FIG. 10b in order to form silicide on the contact regions of the device and thereby decrease the device's contact resistance. The resultant silicide self-aligned MOSFET with a tungsten gate is shown in FIG. 11b.

Figure 12A:
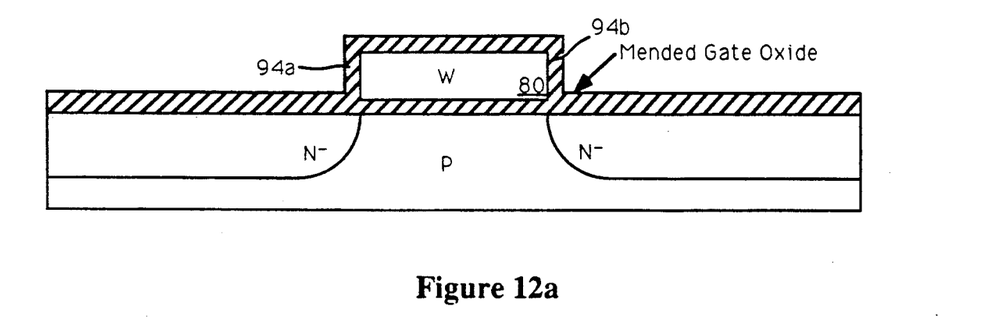
FIG. 12a illustrates the reoxidation of substrate of FIG. 5c after removing the photoresist.

The performance and reliability of the self-aligned overlapped MOSFET of the present invention can be further improved by utilizing a reoxidation step. In FIG. 12a, a reoxidation is made to the substrate shown in FIG. 9c after the photoresist has been removed. The reoxidation deposits about 1000 Å of a low temperature oxide with 8% phosphorous. The oxide is formed by LTLPCVD at 2.00 torr and at 400° C. in 60% $O_2$, 11% $SiH_4$ and 29% DPI. The reoxidation step provides two benefits. First, the reoxidation mends the gate oxide layer where the conductive spacers will eventually be formed. Mending the gate oxide is beneficial because the gate oxide layer can be damaged during the etching of the inner gate member in FIG. 9b. Second, the reoxidation process provides a thin oxide sidewall spacer adjacent to each side of the inner gate member 80. The thin oxide side wall spacers 94a and 94b decrease the gate/drain capacitance associated with the conductive spacer overlap of the drain. Reducing the gate/drain capacitance increases both the speed and gain of the device.

Figure 12B:
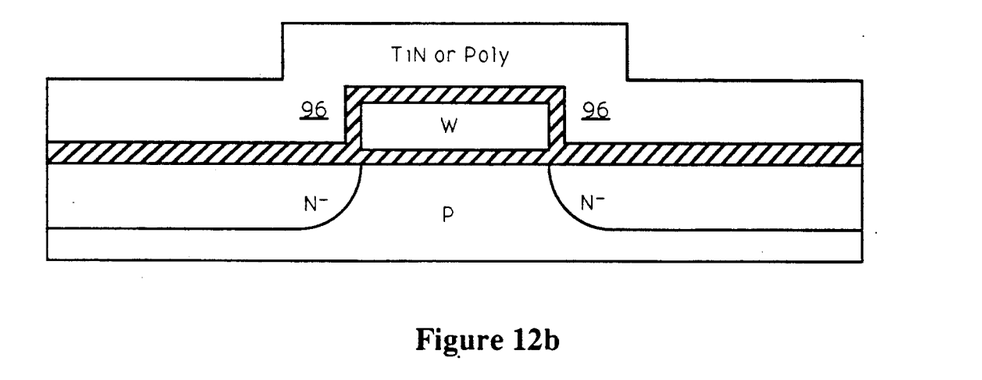
Figure 12C:
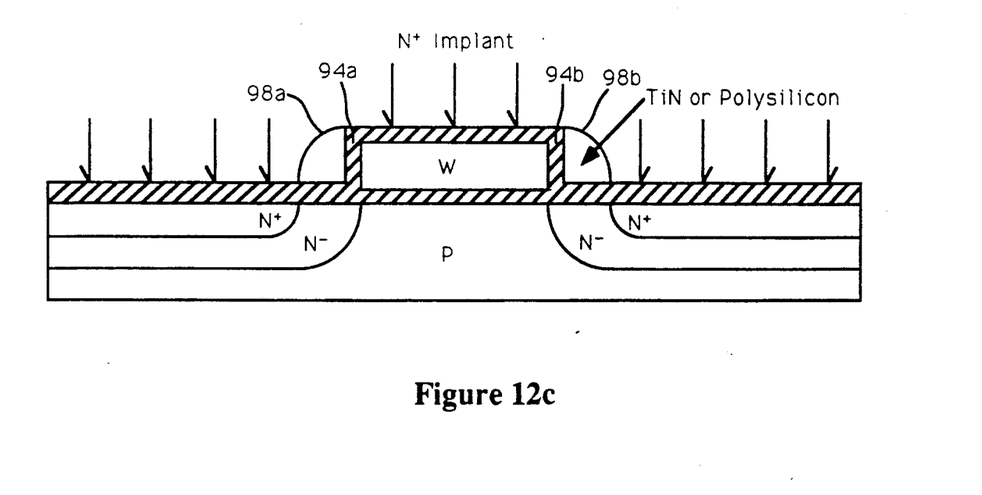
FIG. 12c illustrates the formation of conductive spacers and the formation of n+ source/drain regions on the substrate of FIG. 12b.

After reoxidation, the processes shown in FIGS. 9d and 9e are used to complete the fabrication of the device. In FIG. 12b the process detailed in FIG. 9d is used to deposit a conformal layer of TiN or polysilicon 96 on the reoxidation layer. Next, in FIG. 12c, the TiN or polysilicon layer 96 is etched and the n+ source/drain regions are formed as detailed in FIG. 9e. It is to be noted that although the conductive spacers 98a and 98b the tungsten inner gate member 80 are separated by a thin oxide side wall spacer 94a and 94b, they are electrically coupled together. The heavy n+ source/drain implant of FIG. 9e essentially damages the exposed portion of the thin oxide side wall spacers, effectively coupling the spacers to the tungsten inner gate member 80. It is to be appreciated that the processes of FIGS. 11a and 11b and FIGS. 10a and 10b may also be utilized in order to increase the grading of the device and to decrease the contact resistance of the device, respectively.

It is to be emphasized that although n channel transistors have been described in detail herein, the present invention may also be practiced as a p channel transistor. In fabricating the p channel self-aligned overlap MOSFET, the doping conductives of the p channel device are simply opposite to those of the n channel device. The device is formed in an n type substrate with a p− source/drain region and a p+ source/drain region formed respectively therein. A tungsten or polysilicon inner gate member would still be utilized. The conductive spacers would be fabricated from polysilicon or TiN. Oxide spacers would still be utilized for the alignment and masking of silicide layers and additional grading implants.

Thus a high speed submicron metal-oxide-semiconductor transistor with a VLSI manufacturing process has been realized.

I claim:

1. A high speed submicron channel hot electron resistant metal-oxide-semiconductor transistor ideal for VLSI circuits formed on a semiconductor substrate of a first conductivity type comprising:

a gate oxide layer formed on said substrate;

a polysilicon inner gate electrode of a predetermined length and width covering said gate oxide layer, said polysilicon inner gate electrode including laterally opposite sidewalls along said width of said inner gate electrode;

a pair of lightly doped drain surface oxide layers disposed on respective areas of said substrate adjacent respective sidewalls of said polysilicon inner gate electrode;

a first source region and a first drain region of a second conductivity type having a first concentration of second conductivity type dopant disposed in said substrate in alignment with said sidewalls of said polysilicon inner gate electrode for forming a pair of lightly doped spread apart regions;

a pair of TiN spacers formed adjacent to and in electrical contact with respective sidewalls of said polysilicon inner gate electrode on respective lightly doped drain surface oxide layers for forming along with said polysilicon inner gate electrode a MOSFET gate electrode which overlaps said lightly doped regions; and a second source region and a second drain region of a second concentration dopant of said second conductivity type wherein said second concentration dopant is greater than said first concentration dopant, disposed in said first source region and said first drain region, respectively, self-aligned with the outer edges of said TiN spacers which provide masking.

2. The metal-oxide-semiconductor transistor of claim 1 wherein said first conductivity type is P-type conductivity, and said second conductivity type is N-type conductivity.

3. The metal-oxide-semiconductor device of claim 2 further comprising an oxide sidewall spacer formed between respective TiN spacers and said polysilicon inner gate electrode sidewalls on said lightly doped drain surface oxide layer, said TiN spacers electrically coupled, through said oxide sidewall spacers by impurities in said sidewall spacers from said second concentration dopant, to said polysilicon inner gate electrode, said sidewall spacers reducing the gate-to-drain capacitance of the device.

4. The metal-oxide-semiconductor device of claim 2 or 3 further comprising:
   a silicide layer formed on said second source region and said second drain region and on said polysilicon inner gate electrode for reducing the contact resistance of the device;
   an oxide spacer formed adjacent to each of said TiN spacers for preventing said silicide layer from shorting said TiN spacers to said second source and drain regions.

5. The metal-oxide-semiconductor device of claim 2 or 3 further comprising:
   an oxide spacer formed adjacent to each of said TiN spacers on said second source and drain regions for providing a mask to offset a third source region and a third drain region;
   a third source region and a third drain region of a third concentration of said second conductivity type, wherein said third concentration is greater than said second concentration, disposed in said second source region and second drain region in alignment with the said oxide spacers to provide additional dopant gradient of the source and drain to further improve the devices resistance to hot electrons.

6. A high speed submicron channel hot electron resistant metal-oxide-semiconductor transistor ideal for VLSI circuits formed on a semiconductor substrate of a first conductivity type comprising:
   a gate oxide layer formed on said substrate;
   a tungsten inner gate electrode of a predetermined length and width having a thickness of approximately 1000 Å covering said gate oxide layer, said inner gate electrode including laterally opposite sidewalls along said width of said inner gate electrode;
   a pair of lightly doped drain surface oxide layers disposed on respective areas of said substrate adjacent respective sidewalls of said inner gate electrode;
   a first source region and a first drain region of a second conductivity type having a first concentration of second conductivity type dopant, said first source and drain regions disposed in said substrate in alignment with said sidewalls of said tungsten inner gate electrode for forming a pair of lightly doped spread apart regions;
   a pair of TiN spacers formed from a thin substantially planar TiN layer, said TiN spacers formed adjacent to and in electrical contact with respective sidewalls of said tungsten inner gate electrode on respective lightly doped drain surface oxide layers, said TiN spacers for forming along with said tungsten inner gate electrode a MOSFET gate electrode which overlaps said lightly doped regions; and
   a second source region and a second drain region of a second concentration dopant of said second conductivity type wherein said second concentration dopant is greater than said first concentration dopant, disposed in said first source region and said first drain region, respectively, self-aligned with the outer edges of said TiN spacers which provide masking.

7. The metal-oxide-semiconductor transistor of claim 6 wherein said first conductivity type is P-type conductivity, and said second conductivity type is N-type conductivity.

8. The metal-oxide-semiconductor device of claim 6 further comprising an oxide sidewall spacer formed between respective TiN spacers and said tungsten inner gate electrode sidewalls on said lightly doped drain surface oxide layer, said TiN spacers electrically coupled, through said oxide sidewall spacers by impurities formed in said sidewall spacers from said second concentration dopant, to said tungsten inner gate electrode, said sidewall spacers reducing the gate-to-drain capacitance of the device.

9. The metal-oxide-semiconductor device of claim 7 or 8 further comprising:
   a silicide layer formed on said second source region and said second drain region and on said tungsten inner gate electrode for reducing the contact resistance of the device;
   an oxide spacer formed adjacent to each of said TiN spacers for preventing said silicide layer from shorting said TiN spacers to said second source and drain regions.

10. The metal-oxide-semiconductor device of claim 7 or 8 further comprising:
    an oxide spacer formed adjacent to each of the TiN spacers on said second source and drain regions for providing a mask to offset a third source region and a third drain region;
    a third source region and a third drain region of a third concentration of said second conductivity type, wherein said third concentration is greater than said second concentration, disposed in said second source region and second drain region, respectively, in alignment with said oxide spacers to provide an additional dopant gradient of the source and drain to further improve the devices resistance to hot electrons.

11. A process for making a high speed submicron channel hot electron resistant metal-oxide-semiconductor transistor ideal for VLSI circuits on a semiconductor substrate of a first conductivity type comprising the steps of:
    forming a gate oxide layer on said substrate;
    forming a polysilicon inner gate electrode of a predetermined length and width on said gate oxide layer, said polysilicon inner gate electrode including laterally opposite sidewalls along said width of said inner gate electrode;

implanting a first source region and a first drain region of a second conductivity type having a first concentration of second conductivity type dopant disposed in said substrate in alignment with said sidewalls of said polysilicon inner gate electrode for forming a pair of lightly doped spread apart regions;

forming pair of TiN spacers adjacent to and in electrical contact with respective sidewalls of said polysilicon inner gate electrode on said gate oxide layer for forming along with said polysilicon inner gate electrode a MOSFET gate electrode which overlaps said lightly doped regions, said TiN spacers formed by depositing a substantially planar conformal layer of TiN on said gate oxide layer and on said polysilicon inner gate electrode with a low temperature process to prevent diffusion of said second conductivity type dopant from said first source and drain regions into said semiconductor substrate, said TiN spacers formed from said planar TiN layer by anisotropically dry etching said layer until end point detection; and implanting a second source region and a second drain region of a second concentration dopant of said second conductivity type wherein said second concentration dopant is greater than said first concentration dopant, in said first source region and said first drain region, respectively, self-aligned with the outer edges of said TiN spacers.

12. The process of making the MOSFET of claim 11 further comprising the steps of:

forming a thin oxide sidewall spacer between said TiN spacers and said polysilicon inner gate electrode sidewalls on said gate oxide layer, wherein said TiN spacers are electrically coupled through said oxide sidewall spacers by dopant impurities in said oxide sidewall spacers from said second source and drain implant, said thin oxide sidewall spacer for decreasing the gate/drain capacitance.

13. The process of making the MOSFET of claim 11 or 12 further comprising the steps of:

forming an oxide spacer adjacent to the outside edge of each of said TiN spacers for forming a mask;

forming a third source region and third drain region in said second source region and said second drain region, respectively.

14. The process of making the MOSFET of claim 11 or 12 further comprising the steps of:

forming an oxide spacer adjacent to the outside edge of each of said TiN spacers for forming a mask;

etching away exposed portions of said gate oxide layer;

forming a silicide layer on said second source region and second drain region and on said polysilicon inner gate for reducing the contact resistance of the device.

* * * * *